United States Patent
Huang et al.

(10) Patent No.: US 10,446,646 B2
(45) Date of Patent: Oct. 15, 2019

(54) COBALT SILICIDATION PROCESS FOR SUBSTRATES COMPRISED WITH A SILICON-GERMANIUM LAYER

(71) Applicant: Taiwan Semiconductor Manufacturing Company, Ltd., Hsinchu (TW)

(72) Inventors: Chien-Chao Huang, Hsin-Chu (TW); Yee-Chia Yeo, Singapore (SG); Chao-Hsiung Wang, Hsin-Chu (TW); Chun-Chieh Lin, Hsinchu (TW); Chenming Hu, Alamo, CA (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/613,778

(22) Filed: Jun. 5, 2017

(65) Prior Publication Data
US 2017/0271449 A1 Sep. 21, 2017

Related U.S. Application Data

(60) Continuation of application No. 11/714,416, filed on Mar. 6, 2007, now Pat. No. 9,673,280, which is a (Continued)

(30) Foreign Application Priority Data

Jun. 12, 2003 (TW) ................. 92116010 A

(51) Int. Cl.
*H01L 29/10* (2006.01)
*H01L 21/265* (2006.01)
(Continued)

(52) U.S. Cl.
CPC .... *H01L 29/1054* (2013.01); *H01L 21/02142* (2013.01); *H01L 21/265* (2013.01);
(Continued)

(58) Field of Classification Search
CPC ............. H01L 29/1054; H01L 29/7834; H01L 29/66636; H01L 21/02142; H01L 21/265;
(Continued)

(56) References Cited

U.S. PATENT DOCUMENTS 5,516,724 A 5/1996 Ast et al.
5,624,869 A 4/1997 Agnello et al.
(Continued)

OTHER PUBLICATIONS

Gluck, et al., "CoSi$_2$ and TiSi$_2$ for Si/SiGe Heterodevices," Elsevier Science S.A.., Thin Solid Films 270, 1995, pp. 549-554.
(Continued)

*Primary Examiner* — Laura M Menz
*Assistant Examiner* — Candice Chan
(74) *Attorney, Agent, or Firm* — Haynes and Boone, LLP

(57) ABSTRACT

A method comprises providing a semiconductor alloy layer on a semiconductor substrate, forming a gate structure on the semiconductor alloy layer, forming source and drain regions in the semiconductor substrate on both sides of the gate structure, removing at least a portion of the semiconductor alloy layer overlying the source and drain regions, and forming a metal silicide region over the source and drain regions.

12 Claims, 9 Drawing Sheets

Related U.S. Application Data division of application No. 10/710,012, filed on Jun. 11, 2004, now Pat. No. 7,202,122.

(51) Int. Cl.
*H01L 21/28* (2006.01)
*H01L 21/285* (2006.01)
*H01L 21/8238* (2006.01)
*H01L 29/66* (2006.01)
*H01L 29/78* (2006.01)
*H01L 21/02* (2006.01)

(52) U.S. Cl.
CPC .. *H01L 21/28052* (2013.01); *H01L 21/28518* (2013.01); *H01L 21/28525* (2013.01); *H01L 21/823807* (2013.01); *H01L 21/823814* (2013.01); *H01L 29/66636* (2013.01); *H01L 29/7834* (2013.01)

(58) Field of Classification Search
CPC ....... H01L 21/823807; H01L 21/28525; H01L 21/28518; H01L 21/28052; H01L 21/823814
See application file for complete search history.

(56) References Cited

U.S. PATENT DOCUMENTS

| | | | |
|---|---|---|---|
| 5,710,438 A * | 1/1998 | Oda | H01L 21/28052 257/382 |
| 6,117,723 A | 9/2000 | Huang | |
| 6,171,959 B1 | 1/2001 | Nagabushnam | |
| 6,214,679 B1 | 4/2001 | Murthy et al. | |
| 6,271,551 B1 | 8/2001 | Schmitz et al. | |
| 6,376,342 B1 | 4/2002 | Tseng | |
| 6,475,869 B1 | 11/2002 | Yu | |
| 6,492,216 B1 * | 12/2002 | Yeo | H01L 29/1054 257/E21.431 |
| 6,657,223 B1 | 12/2003 | Wang et al. | |
| 6,852,600 B1 | 2/2005 | Wang et al. | |
| 6,924,182 B1 | 8/2005 | Xiang et al. | |
| 6,972,250 B2 | 12/2005 | Cabral et al. | |
| 7,030,465 B2 | 4/2006 | Shima et al. | |
| 7,473,947 B2 | 1/2009 | Murthy et al. | |

OTHER PUBLICATIONS

Krivokapic, et al, "Nickel Silicide Metal Gate FDS01 Devices with Improved Gate Oxide Leakage," IEEE, 2002, 0-7803-7469-X/02, 4 pages.

Nayak, et. al., Enhancement-Mode Quantum-Well GexSi1-x PMOS, IEEE Electron Device Letters, vol. 12, No. 4, Apr. 1991, pp. 154-156.

Xiang, et al., "Strained Silicon NMOS with Nickel-Silicide Metal Gate," 2003 Symposium on VLSI Technology Digest of Technical Papers, 4-89114-035-6/03, 2 pages.

Yeo, et al., "Enhanced Performance in Sub-100 nm CMOSFETs Using Strained Epitaxial Silicon-Geramanium," IEDM, pp. 753-756.

* cited by examiner

COBALT SILICIDATION PROCESS FOR SUBSTRATES COMPRISED WITH A SILICON-GERMANIUM LAYER

The present application is a continuation patent application of U.S. patent application Ser. No. 11/714,416, filed on Mar. 6, 2007, which will issue as U.S. Pat. No. 9,673,280, which is a division of U.S. patent application Ser. No. 10/710,012 filed Jun. 11, 2004, now U.S. Pat. No. 7,202,122, which claims the benefit of Taiwanese Patent Application No. 92116010, filed Jun. 12, 2003, the disclosures of which are hereby incorporated by reference in their entirety.

BACKGROUND

Performance of complimentary metal oxide semiconductor (CMOS) devices have been enhanced via increases in drive current achieved via strain induced band structure modification. Channel regions formed in a silicon layer under biaxial tensile strain have allowed enhanced electron mobility to be realized for N-channel or NMOS devices. This is accomplished via formation of the silicon layer on an underlying relaxed semiconductor alloy layer, such as a silicon-germanium layer, which in turn is formed on the underlying semiconductor substrate. In addition, enhanced hole mobility can be realized via formation of a P-channel or PMOS device in a silicon-germanium layer with biaxial compressive strain. The presence of the performance enhancing silicon-germanium layer however presents difficulties during subsequent metal silicide formation processes. For example, silicidation processes, applied to a CMOS source/drain region will consume part or all of the silicon-germanium layer overlying the source/drain region. During the silicidation process, germanium atoms tend to segregate and accumulate at the surfaces of the metal silicide grains. The resulting germanium-rich interfacial layer at the surface of the metal silicide grains behave as a diffusion barrier and retard complete formation of the desired metal silicide layer, thus resulting in a lower than desired conductivity of the metal silicide layer when compared to metal silicide counterparts formed from non-semiconductor alloy layers. The decrease in metal silicide conductivity or the increase in metal silicide resistance will negatively influence CMOS performance.

BRIEF DESCRIPTION OF THE DRAWINGS

The object and other advantages of this invention are best described in the preferred embodiment with reference to the attached drawings that include.

DETAILED DESCRIPTION

Various embodiments of a method for formation of a metal silicide layer over source/drain regions of a semiconductor device with a silicon-germanium layer are described herein. Embodiments provide for the removal (full or partial) or altering of silicon-germanium. It should be noted that the various process parameters described herein are provided as exemplary details and that other suitable procedures and parameters may be used to accomplish the same.

Figure 1:
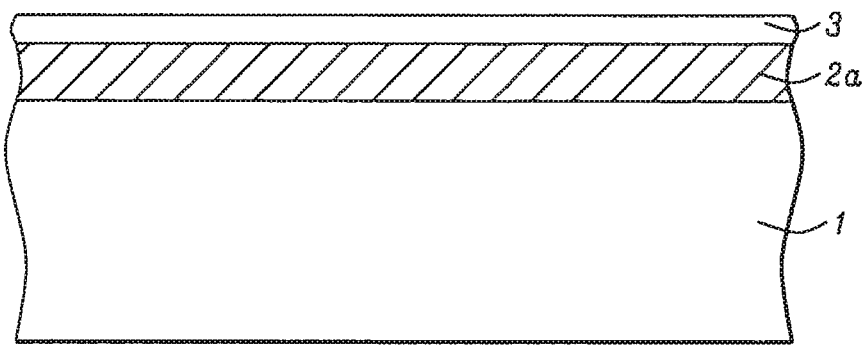
FIGS. 1-12 are cross-sectional views of first and second embodiments of a method used to partially or totally remove portions of a silicon-germanium layer from the surface of source/drain regions prior to formation of metal silicide on the source/drain region.

In FIG. 1, a semiconductor substrate 1 comprising single crystalline silicon featuring a <100> crystallographic orientation may be used. To form a P-channel or PMOS device, a semiconductor alloy layer such as a silicon-germanium layer 2a, obtained under biaxial compressive strain, may be used to enhance hole mobility in a channel region located in the compressively strained silicon-germanium layer. The silicon-germanium layer 2a may be epitaxially grown on the semiconductor substrate 1, to a thickness between about 40 to 400 Angstroms, featuring a weight percent of germanium between about 10 to 40 percent, for example. To avoid partial consumption of silicon-germanium layer 2a during subsequent growth of an overlying gate insulator layer, a silicon capping layer 3, may be epitaxially grown over the silicon-germanium layer 2a. The silicon capping layers may have a thickness between about 20 to 100 Angstroms.

Figure 2:
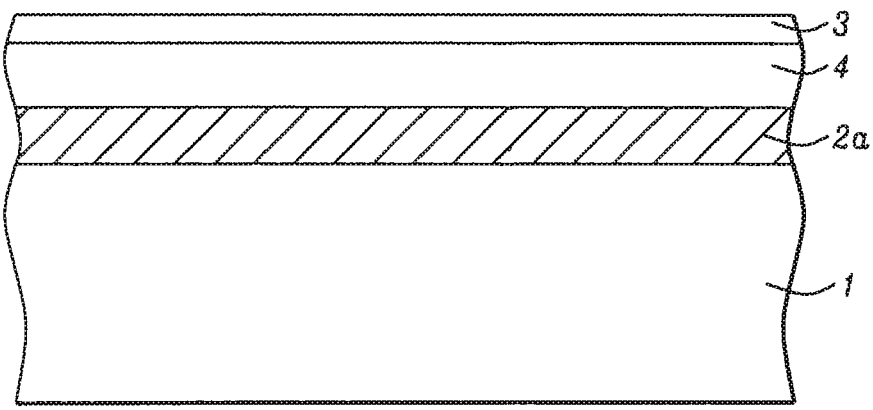

If an NMOS or N-channel device is to be formed, enhanced electron mobility or enhanced performance may be accomplished by locating the NMOS channel region in a silicon layer 4 under biaxial tensile strain. This is schematically shown in FIG. 2. The silicon layer 4 may be epitaxially grown over the underlying silicon-germanium layer 2a. The silicon layer 4 may have a thickness between about 20 to 100 Angstroms. Again to avoid consumption of the material used to accommodate the device channel region during gate insulator formation, a silicon capping layer 3, is formed over the silicon layer 4. If desired, the process herein may also be applied to an NMOS device in which a silicon layer, under biaxial tensile strain, overlays a silicon-germanium layer.

Figure 3:
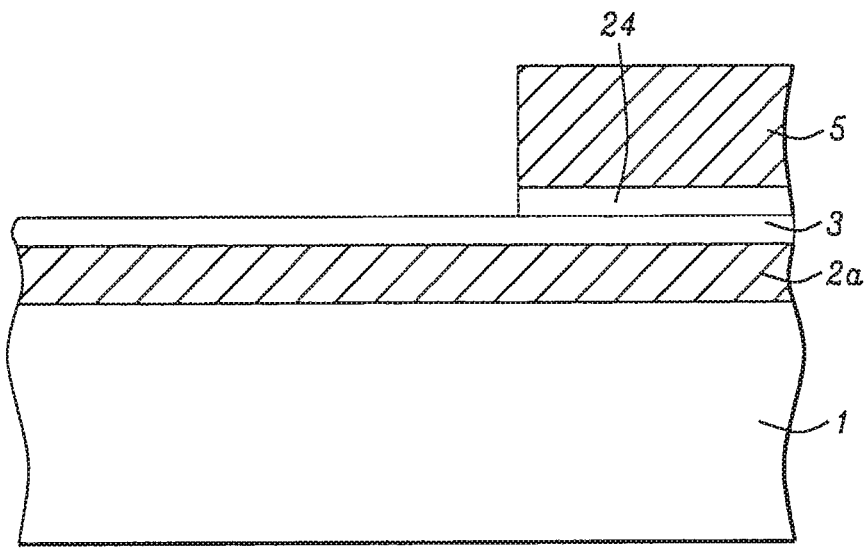
Figure 4:
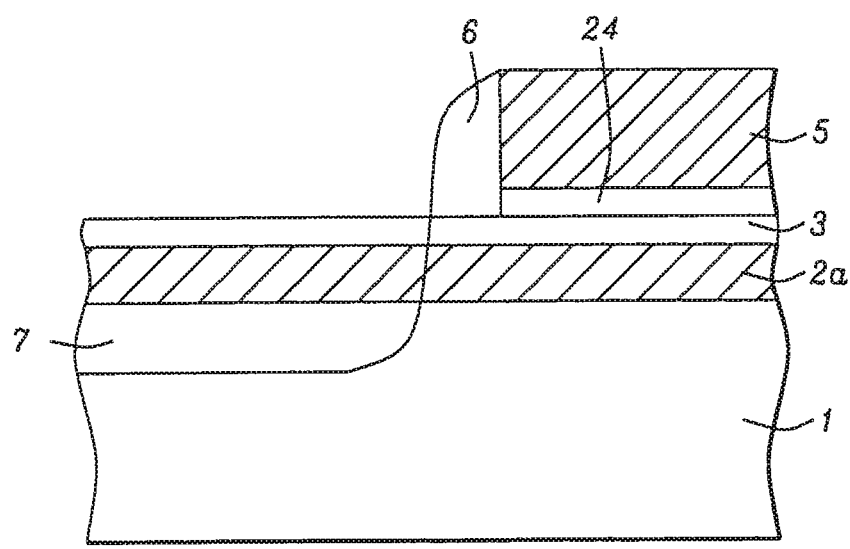

In FIG. 3, a gate insulator layer 24, comprised of silicon dioxide may be thermally grown to a thickness between about 8 to 50 Angstroms, for example, over the silicon capping layer 3. A conductive layer such as a doped polysilicon layer 5, may be deposited via low pressure chemical vapor deposition (LPCVD) to a thickness between about 600 to 2000 Angstroms, for example. The polysilicon layer 5 may be doped in situ during deposition via the addition of arsine or phosphine to a silane ambient, or the polysilicon layer 5 may be deposited intrinsically then doped via implantation of arsenic or phosphorous ions. If lower line resistance is desired, a composite layer (not shown) comprised of an underlying doped polysilicon layer and an overlying metal silicide layer may be employed. The metal silicide layer can be a titanium silicide or tungsten silicide layer, for example, or other suitable materials. A photoresist may be used to pattern etch and define conductive gate structure from the polysilicon layer 5. An anisotropic reactive ion etching (RIE) procedure may be used using chlorine or flourine-based gas as a selective etchant for the polysilicon, or for the composite layer. Removal of the photoresist may be accomplished using known or later developed plasma oxygen ashing and wet clean procedures. A buffered hydrofluoric acid component of the wet clean procedure may remove a portion of the gate insulator layer 24 not covered by the polysilicon layer 5.

If desired, a lightly doped source/drain (LDD) region (not explicitly shown) may be formed in the semiconductor alloy layer 2a and in the semiconductor substrate 1 not covered by the conductive gate structure 5. The LDD regions may be formed by known processes such as ion implantation. The LDD region may also be defined in the exposed portion of the silicon capping layer 3. An insulator layer 6 such as silicon nitride is formed over the device. The insulator layer 6 may have thickness between about 150 to 1000 Angstroms formed using LPCVD or plasma enhanced chemical vapor deposition (PECVD), for example. An anisotropic RIE procedure, using $CF_4$ as an etchant for silicon nitride, for example, is employed to define the insulator layer spacers 6 on the sides of conductive gate structure 5. Heavily doped source/drain regions 7, are formed via implantation of the desired species in portions of silicon-germanium layer 2a, and in portions of semiconductor substrate 1 not covered by the gate structure 5, or insulator spacers 6. Heavily doped source/drain regions 7 for a PMOS device may be formed via implantation of boron or $BF_2$ ions, for example. For an NMOS device, the heavily doped source/drain regions 7 may be formed via implantation of arsenic or phosphorous ions for example.

For performance optimization, minimum source/drain resistance is desired. This can be accomplished via formation of a metal silicide region on the underlying source/drain region. The metal silicide region may be formed via consumption of portions of the silicon-germanium layer 2a, as well as via consumption of portions of semiconductor substrate 1. However, during the silicidation procedure, germanium atoms may segregate and accumulate at the surface of the metal silicide grains. The germanium-rich interfacial layer at metal silicide surfaces may act as a diffusion barrier and retard complete formation of the metal silicide region, thus not allowing the desired minimum source/drain resistance to be realized. A first embodiment of this invention in which the portion of silicon-germanium layer 2a, is either partially or totally removed from above the source/drain regions prior to the silicidation procedure, is now addressed and schematically shown in FIGS. 5-10.

Figure 5:
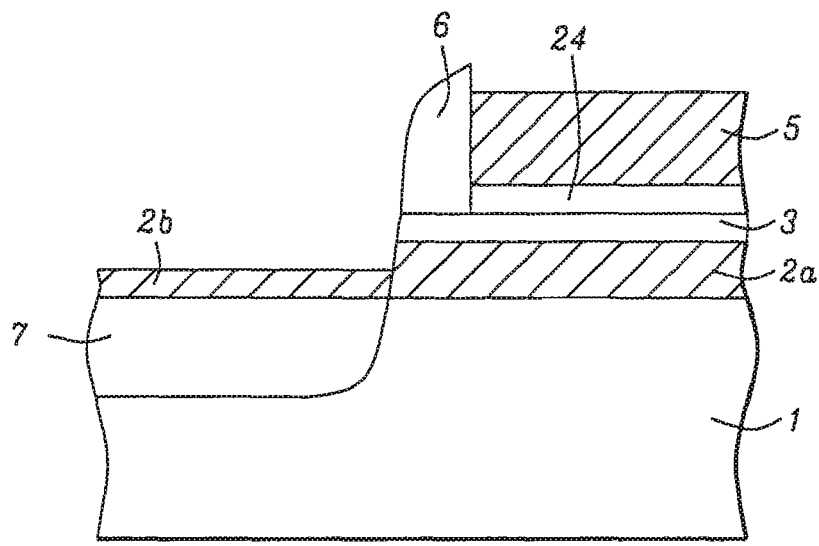
Figure 6:
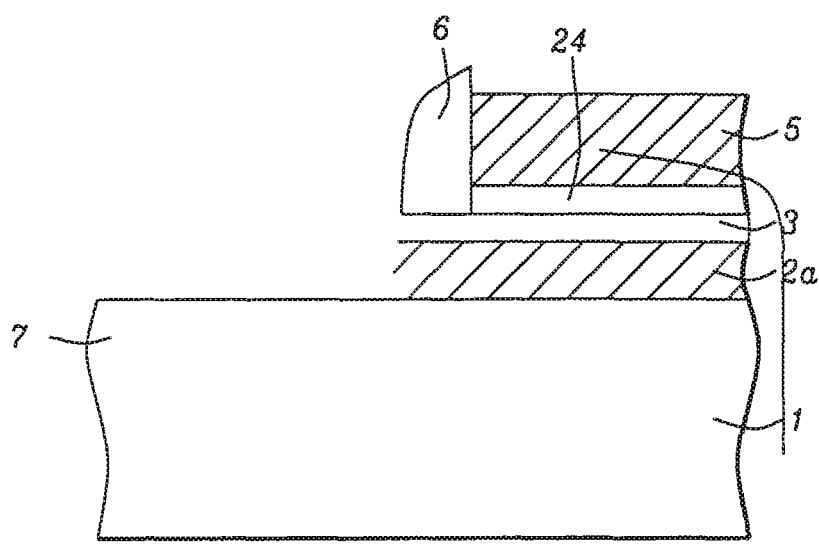

Referring to FIG. 5, partial removal of silicon-germanium layer 2a, is accomplished via a selective anisotropic RIE procedure, using $Cl_2$, or $SF_6$, or a flourine-based gas as an etchant, for example. The remaining silicon germanium portion 2b may have a reduced thickness between about 20 to 200 Angstroms. The thinner silicon-germanium layer 2b may result in less germanium segregation at the surfaces of a metal silicide region during a silicidation procedure, when compared to counterpart metal silicide regions formed on thicker silicon-germanium layers. Total removal of exposed portions of silicon-germanium, shown schematically in FIG. 6, may be accomplished via a more prolonged selective anisotropic RIE procedure. In other words, by varying the process time of the etching process, the silicon-germanium layer 2a may be partially or totally removed depending on the desired result. In both examples the selectivity of the RIE procedure features the non-etching of insulator spacers 6, however the conductive gate structure 5 may be thinned during the anisotropic RIE procedure used to partially or totally remove silicon-germanium from the top surface of source/drain regions 7.

Figure 7:
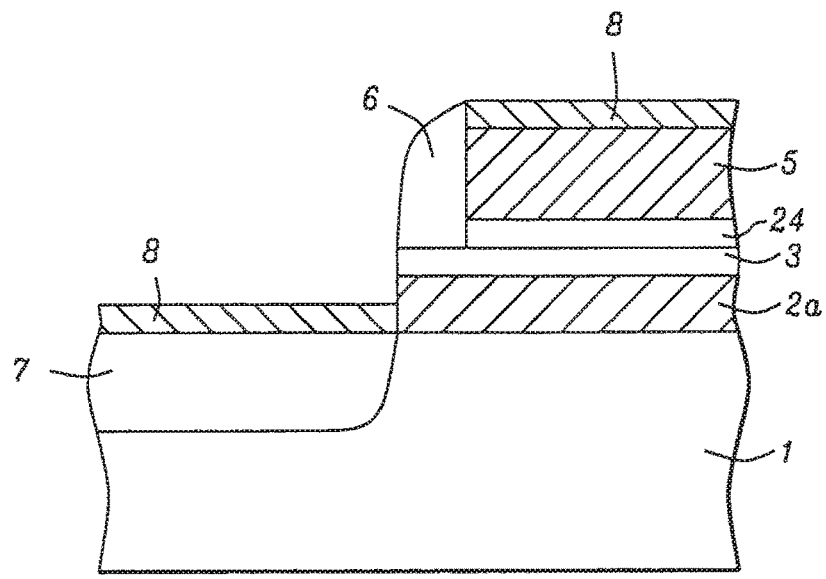

In FIG. 7, deposition of a metal layer such as cobalt, via a process such as physical vapor deposition (PVD) may be performed. An anneal procedure follows. The resulting metal silicide structures regions 8, are over the source/drain regions 7, as well as on the conductive gate structure 5. The anneal may be a rapid thermal anneal (RTA) process at a temperature between about 300 to 900° C., for between 0.1 to 180 seconds in an inert ambient, for example. The metal silicide regions 8 may have a thickness between about 50 to 150 Angstroms. If desired, the anneal process may be performed using conventional furnace procedures. The metal silicide regions 8, such as cobalt silicide regions may be formed via the consumption of the semiconductor substrate 1, for the case in which silicon-germanium was totally removed prior to the silicidation procedure, or formed via consumption of the thinned silicon-germanium layer 2b, in addition to the consumption of a top portion of semiconductor substrate 1, underlying the thinned silicon-germanium layer 2b. The metal silicide regions 8 may also be formed on the top surface of the gate structure 5, however portions of the metal layer, cobalt in this example, located on the surface of insulator spacers 6, may remain unreacted. Unreacted cobalt may be selectively removed via a wet etch procedure such as by using a solution of $HNO_3$ or HF, for example.

Figure 8:
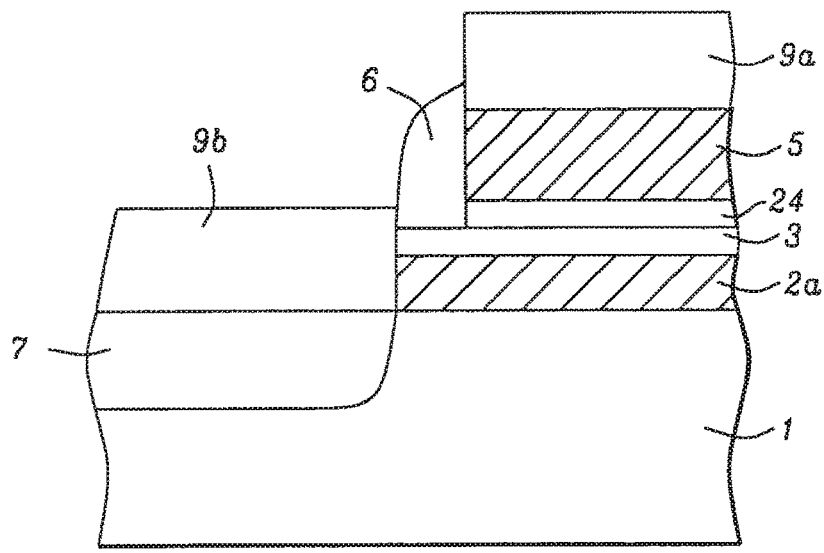

A second embodiment of this invention is the partial or total removal of portions of a silicon-germanium layer located over the source/drain regions via oxidation of the exposed portions of silicon-germanium followed by the removal of the oxidized regions. FIG. 8 schematically shows the result of a thermal oxidation procedure used to form a silicon dioxide region 9b, by total consumption of the silicon-germanium layer 2a. This may be accomplished by a thermal oxidation procedure performed in an oxygen-steam ambient, for example. The thermal oxidation process temperature may be between about 500 to 1000° C. resulting in the silicon oxide region 9b at a thickness between about 8 to 50 Angstroms, over the source/drain regions 7. If desired, the thermal oxidation procedure can be performed using conditions that will convert only a top portion of the silicon-germanium layer to silicon oxide, thus leaving a bottom portion of the silicon-germanium on the underlying source/drain regions 7. The thermal oxidation procedure may also result in the formation of a silicon oxide region 9a, at a thickness between about 600 to 2000 Angstroms, on the gate structure 5.

Figure 9:
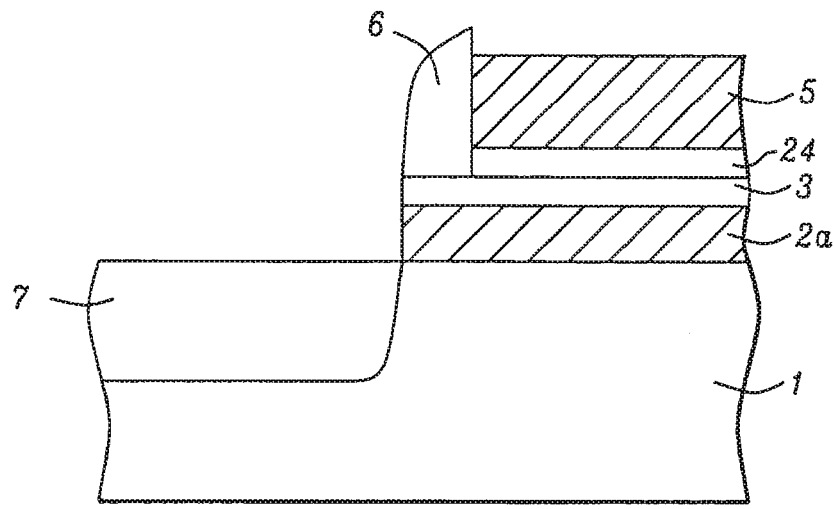
Figure 10:
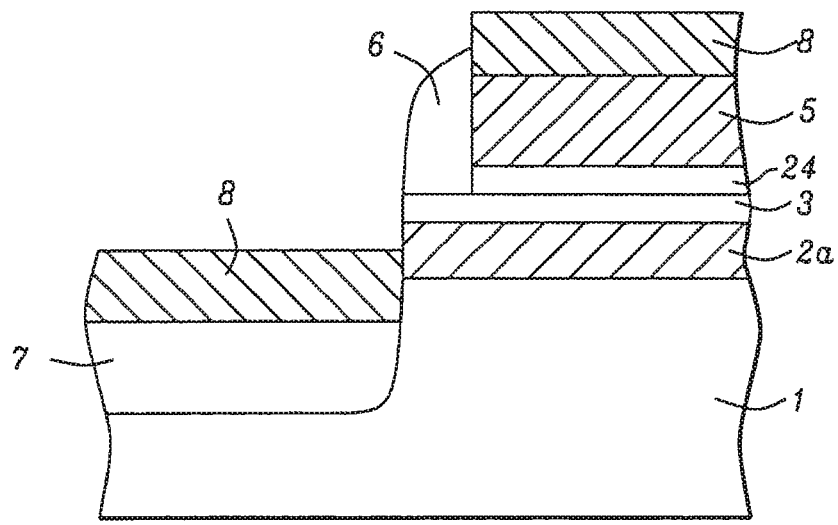

The selective removal of the silicon oxide regions 9a and 9b is next addressed and schematically shown in FIG. 9. A wet etch procedure using a buffered hydrofluoric acid solution selectively removes the silicon oxide region 9b, a silicon oxide region formed via consumption of silicon-germanium, from the top surface of the source/drain regions 7. The selective wet etch procedure may also remove the silicon oxide region 9a, from the top surface of the conductive gate structure 5. If desired, the selective removal of the silicon oxide regions may be accomplished via dry etching procedures using $CHF_3$, for example, as a selective etchant for silicon oxide. The total or partial removal of silicon-germanium via an oxidation-removal sequence allows a subsequent silicidation procedure to be performed either with or without a reduced level of germanium segregation at the surface of the metal silicide grains. The silicidation procedure, similar or identical to the procedure previously described is again performed to form a cobalt silicide region 8 on the source/drain regions 7, as well as on the conductive gate structure 5. This is shown in FIG. 10.

Figure 11:
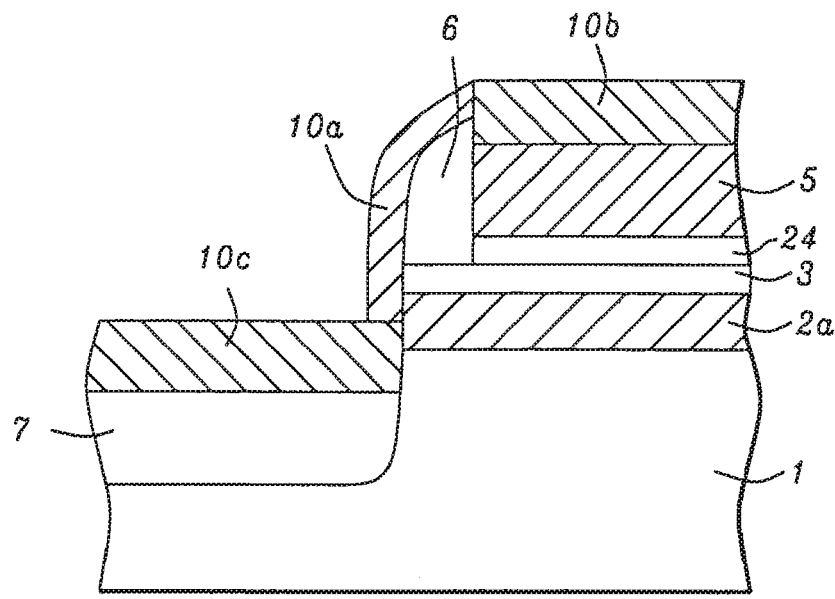

In FIG. 11, an iteration of the second embodiment of this method entails partial or total removal of portions of silicon-germanium via formation and removal of disposable metal silicide regions, prior to the formation of the desired metal silicide regions on the source/drain region. The disposable metal silicide layers are formed via deposition of a cobalt or titanium layer 10a-10c via PVD procedures, for example. The thickness of the cobalt or titanium layer 10a-10c is chosen to either partially or totally remove silicon-germanium from above the source and drain regions. For this example, the total consumption of silicon-germanium overlying source/drain regions 7, in semiconductor substrate 1 may comprise depositing cobalt or titanium layer 10a, to a thickness between about to 50 to 150 Angstroms. A first RTA procedure may be performed, at a temperature between about to 300 to 900° C., for a time between about 0.1 to 180 seconds, resulting in the formation of disposable metal silicide region 10c (cobalt silicide or titanium silicide) on the source/drain regions 7, and metal silicide region 10b on the gate structure 5. Portions of metal layer 10a located on the insulator spacers 6 may remain unreacted. If only partial removal of silicon-germanium is desired, the disposable metal silicide region 10c would overlay an unconsumed bottom portion of the silicon-germanium layer.

Figure 12:
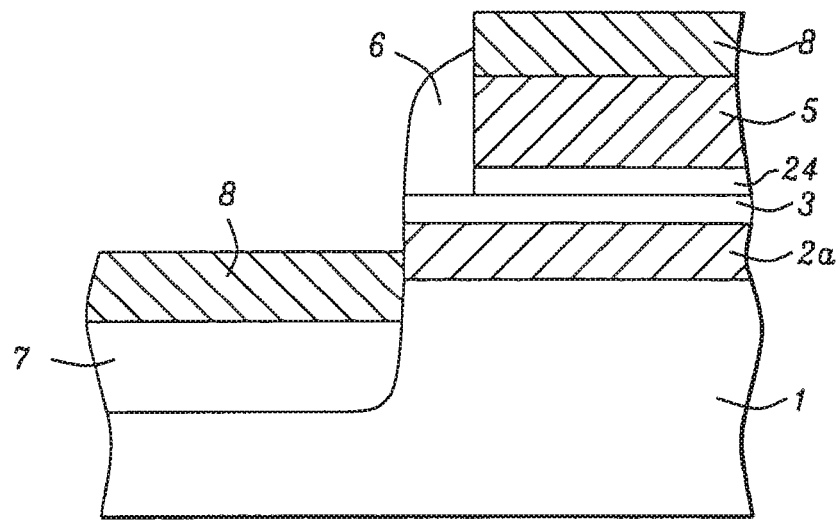

A selective wet etch procedure may be used to remove the unreacted portions of metal layer 10a from the surface of the insulator spacers 6, followed by a selective dry or wet etch procedure used to remove the disposable metal silicide regions 10c and 10b from the source/drain and conductive gate regions. The selective dry etch option is accomplished using $Cl_2$, $SF_6$ or Flourine-based gases, for example, as a selective etchant for the disposable metal silicide regions, terminating at the appearance of underlying source/drain regions 7, and underlying conductive gate structure 5. The selective wet etch option may be performed using $HNO_3$, HF or $H_3PO_4$, for example, as the selective etchant for both the disposable metal silicide region 10c on the source/drain regions 7 and the disposable metal silicide region 10b located on the conductive gate structure 5. The formation of the desired metal silicide region on both source/drain regions 7 and on conductive gate structure 5 may be accomplished via the deposition of cobalt via PVD procedures, for example, at a thickness between about 50 to 150 Angstroms. A second RTA procedure may be employed at a temperature between about 300 to 900° C., for a time between about 0.1 to 180 seconds, in an inert ambient, resulting in the formation of metal silicide, or cobalt silicide region 8, on source/drain regions 7, and on conductive gate structure 5, as shown in FIG. 12. The cobalt silicide region 8 located on source/drain regions 7 is without germanium at the grain surfaces thus allowing the complete formation of the low resistance cobalt silicide region. If partial removal of silicon-germanium were accomplished via the formation and removal of a disposable metal silicide region, the subsequent cobalt silicide region would still be formed with a reduced level of germanium segregation when compared to counterparts formed consuming the entire thickness of underlying silicon-germanium. The removal of portions of unreacted cobalt located on the surface of insulator spacers 6 may be selectively accomplished via wet etch procedures, again using a solution of $HNO_3$, HF or $H_3PO_4$, for example.

Figure 13:
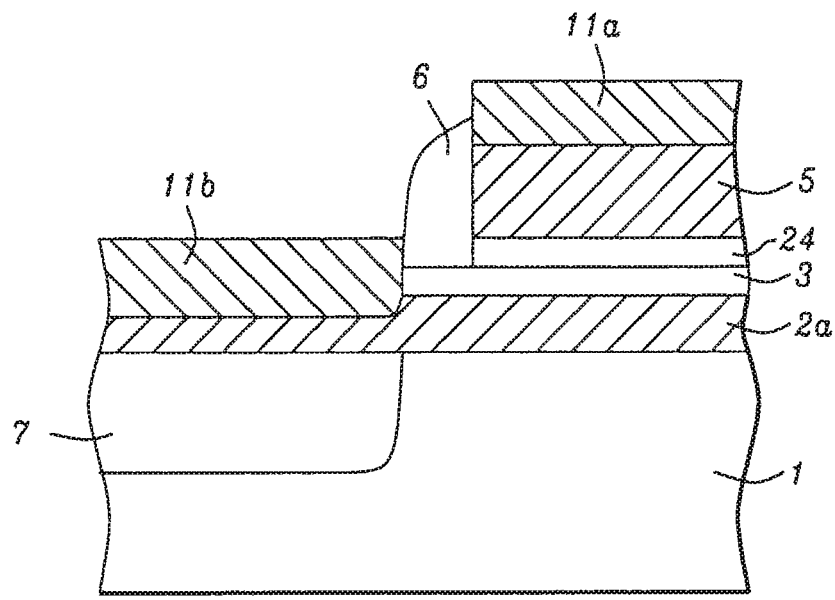
FIGS. 13-18 are cross-sectional views of third and fourth embodiments of a method used to reduce unwanted germanium segregation in the grains of the metal silicide layer during the metal silicide formation procedure.
Figure 14:
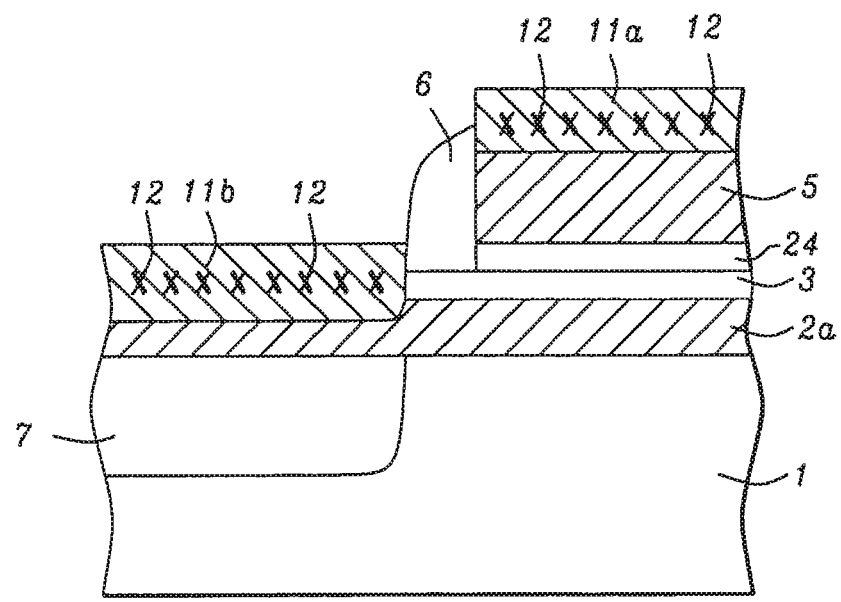
Figure 15:
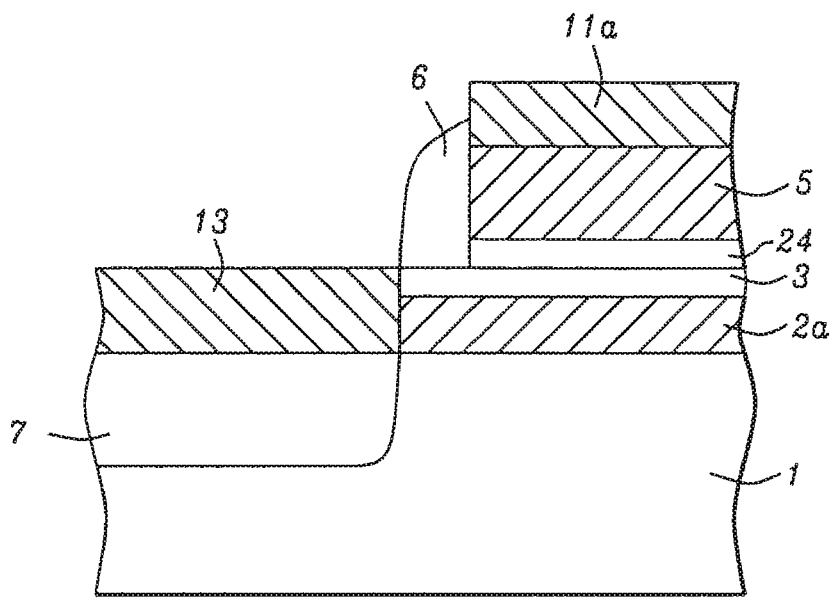

Additional embodiments of the method described herein are described and schematically shown in FIGS. 13-15. A cobalt layer is deposited via PVD procedures, for example, to a thickness between about 50 to 100 Angstroms. A first RTA procedure may be next employed, at a temperature between about 300 to 900° C. for a time between about 0.1 to 180 seconds in an inert ambient, resulting in the formation of a $Co(Si_xGE_{1-x})$ layer 11b on a bottom portion of silicon germanium layer 2a, in a region in which silicon-germanium layer 2a, overlays the source/drain regions 7. The RTA procedure also results in metal silicide, or cobalt silicide layer 11a, on the conductive gate structure 5, while portions of the cobalt layer located on insulator spacers 6, remain unreacted. The selective removal of unreacted cobalt may be accomplished by the use of wet etch procedures, for example. The result of these procedures is schematically shown in FIG. 13.

To reduce the segregation of germanium at the surface of cobalt silicide grains during a second RTA procedure, specific species may be first implanted into the $Co(Si_x Ge_{1-x})$ layer 11b. For example, a first group of implanted species may comprise nitrogen or silicon ions, implanted at an energy between about 10 to 100 KeV, at a heavy dose between about $10^{13}$ to $10^{16}$ atoms/cm². A second group of implanted species, offering the same retardation of germanium atoms may comprise arsenic or phosphorous ions, implanted at an energy between about 10 to 100 KeV, at a dose between about $10^{13}$ to $10^{16}$ atoms/cm². The second group may be implanted at a lighter dose than that of the first group of implanted species. FIG. 14 schematically shows implanted species 12, in both the $Co(Si_x Ge_{1-x})$ layer 11b over the source/drain 7 and the cobalt silicide layer 11a on conductive gate structure 5.

The second RTA procedure is now used to form a cobalt silicide region 13 on the source/drain regions 7. The second RTA procedure may be performed at a temperature between about 500 to 900° C., for a time between about 0.1 to 180 seconds, in an inert ambient. The presence of implanted species 12 in the $Co(Si_xGe_{1-x})$ layer 11b reduces the segregation of germanium at the surfaces of the grains of the cobalt silicide region 13, allowing a minimum resistance of the metal silicide region to be realized. Cobalt silicide region 11a located on conductive gate structure 5, also comprised with implanted species 12, remains unchanged during the second RTA procedure. The result of the second RTA procedure is schematically shown in FIG. 15. Although this embodiment is described where only a top portion of the silicon-germanium layer 2a was converted to a $Co(Si_x Ge_{1-x})$ layer during the first RTA procedure, the entire portion of silicon-germanium may be converted to $Co(Si_x Ge_{1-x})$ during the first RTA procedure and prior to the implantation procedure, if desired. The implanted species in the thicker $Co(Si_x Ge_{1-x})$ layer is still operable to reduce germanium segregation during the second RTA procedure.

Figure 16:
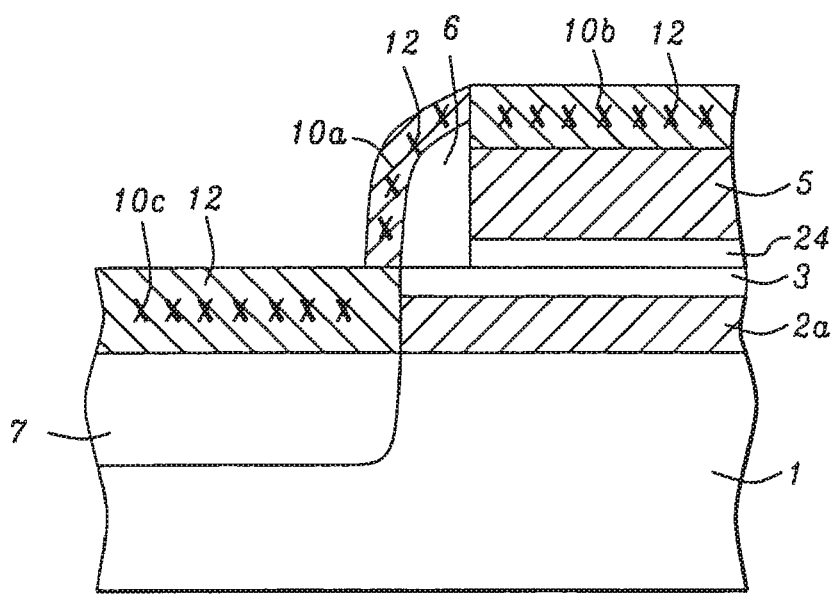
Figure 17:
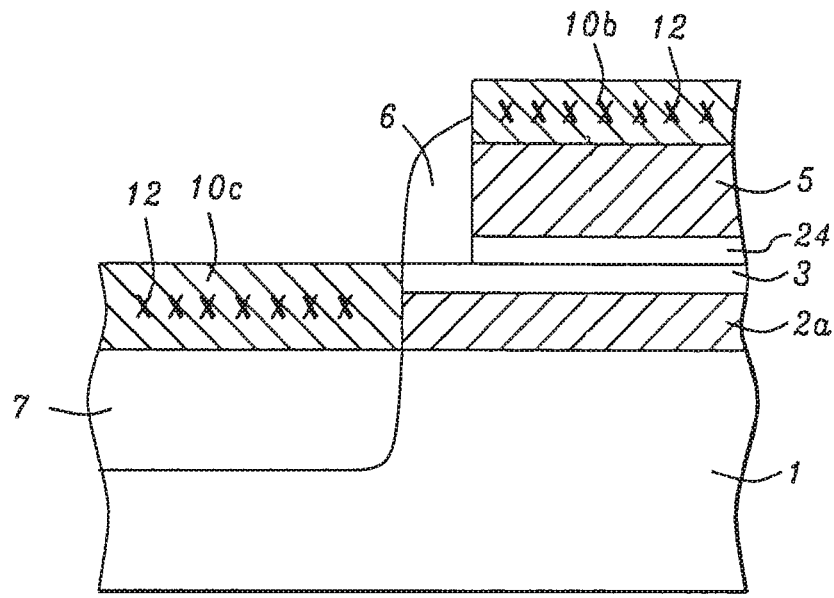

A further embodiment of the method disclosed herein entails the implantation of the same species described above however prior to the first RTA procedure. Referring to FIG. 16, after the deposition of the cobalt layer 10a, the implantation procedure is performed and then followed by the first RTA procedure, resulting in a $Co(Si_x Ge_{1-x})$ layer 10c on the source/drain regions 7. The above procedures also results in the formation of cobalt silicide layer 10b on the conductive gate structure 5. The implantation of species 12 such as silicon ions may be performed at an energy between about 10 to 100 KeV, at a dose between about $10^{13}$ to $10^{16}$ atoms/cm², for example. The first RTA procedure may be performed at a temperature between about 300 to 900° C., for a time between about 0.1 to 180 seconds. The cobalt layer 10a residing on insulator spacers 6 remains unreacted during the first RTA procedure and may be selectively removed by the use of a solution comprised of $HNO_3$, HF or $H_3PO_4$, for example. This is schematically shown in FIG. 17.

Figure 18:
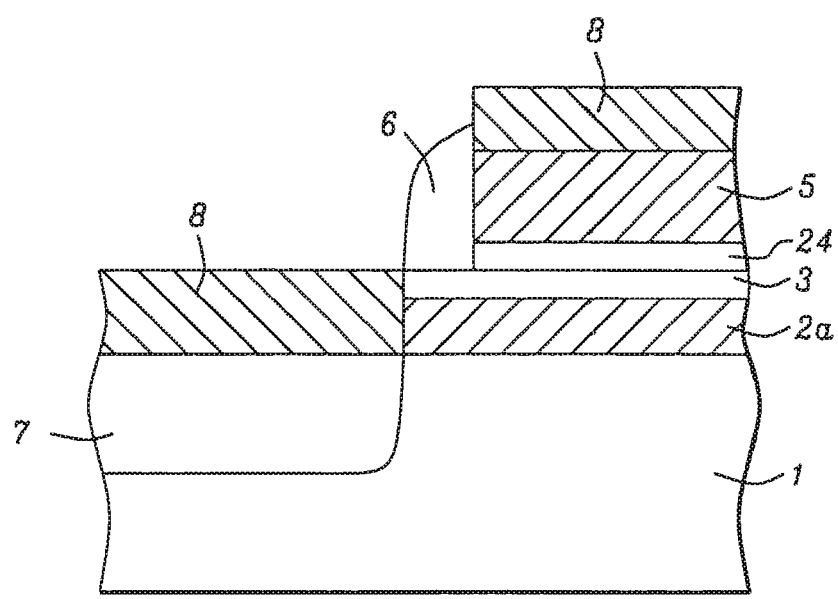

A second RTA procedure may be performed. The RTA process may use a temperature between about 500 to 900° C., for a time between about to 0.1 to 180 seconds in an inert ambient, resulting in the formation of the cobalt silicide region 8 on source/drain regions 7. The presence of implanted species 12 in the $Co(Si_x Ge_{1-x})$ layer 10c minimizes germanium segregation to the grains of cobalt silicide region 8, resulting in minimum resistance in the metal silicide region. The result of the second RTA procedure is schematically shown in FIG. 18.

While this invention has been particularly shown and described with reference to, the preferred embodiments thereof, it will be understood by those skilled in the art that various changes in form and details may be made without departing from the spirit and scope of this invention.

What is claimed is:

1. A semiconductor device comprising:
a substrate formed of a semiconductor material;
a gate structure formed over the substrate;
source and drain regions formed of the semiconductor material on both sides of the gate structure in the substrate;
a first semiconductor alloy layer portion in the substrate below the gate structure, the first semiconductor alloy layer portion being formed of a material that is different than the semiconductor material, wherein the first semiconductor alloy layer portion extends above the source and drain regions; and
a second semiconductor alloy layer portion in the substrate overlying the first semiconductor alloy layer portion and the source and drain regions, the second semiconductor alloy layer portion being formed of a material that is different than the semiconductor material, wherein the material of the second semiconductor alloy layer portion is a silicide of the material of the first semiconductor alloy layer portion, and wherein the second semiconductor alloy layer portion includes one of nitrogen and silicon ions implanted.

2. The semiconductor device of claim 1, wherein the first semiconductor alloy layer portion includes SiGe.

3. The semiconductor device of claim 1, wherein the second semiconductor alloy layer portion includes $Co(Si_xGE_{1-x})$ where x is greater than 0.

4. The semiconductor device of claim 1, wherein the first semiconductor alloy layer portion has a first thickness under the gate structure and a second thickness under the second semiconductor alloy layer portion, the first thickness being greater than the second thickness.

5. The semiconductor device of claim 4, wherein the first semiconductor alloy layer having the first thickness extends under a gate spacer abutting the gate structure.

6. A semiconductor device comprising:
a substrate formed of a semiconductor material having a first portion and a second portion;
a gate structure formed over the first portion of the substrate, wherein the gate structure has a gate dielectric layer that interfaces a top surface of the substrate;
source and drain regions disposed on opposite sides of the gate structure and formed of the semiconductor material in the second portion of the substrate;
a first semiconductor alloy layer in the first portion of the substrate, the first semiconductor alloy layer being formed of a material that is different than the semiconductor material; and
a second semiconductor alloy layer in the second portion of the substrate overlying the source and drain regions, the second semiconductor alloy layer being formed of a material different than the semiconductor material, wherein the material of the second semiconductor alloy layer includes an ion implanted species that prevents segregation of the material of the first semiconductor alloy layer to a surface of the second semiconductor alloy layer, and wherein the second semiconductor alloy layer has a top surface coplanar with the top surface of the substrate interfacing the gate dielectric layer and extends to the semiconductor material of the substrate.

7. The semiconductor device of claim 6, wherein a top surface of the first semiconductor alloy layer is non-coplanar with respect to the top surface of the second semiconductor alloy layer.

8. The semiconductor device of claim 6, wherein a bottom surface of the first semiconductor alloy layer is substantially coplanar with a bottom surface of the second semiconductor alloy layer.

9. The semiconductor device of claim 6, wherein the material of the second semiconductor alloy layer is a metal silicide and the semiconductor material is silicon.

10. The semiconductor device of claim 9, wherein the metal silicide of the second semiconductor alloy layer is CoSi.

11. The semiconductor device of claim 6, wherein the first semiconductor alloy layer includes SiGe and the semiconductor material is silicon.

12. The semiconductor device of claim 6, wherein the first semiconductor alloy layer is thinner than the second semiconductor alloy layer.

* * * * *